US009368368B2

(12) United States Patent
Metz

(10) Patent No.: US 9,368,368 B2
(45) Date of Patent: Jun. 14, 2016

(54) METHOD FOR INCREASING OXIDE ETCH SELECTIVITY

(71) Applicant: Tokyo Electron Limited, Minato-ku, Tokyo (JP)

(72) Inventor: Andrew Metz, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/336,079

(22) Filed: Jul. 21, 2014

(65) Prior Publication Data

US 2016/0020114 A1 Jan. 21, 2016

(51) Int. Cl.
*H01L 21/311* (2006.01)

(52) U.S. Cl.
CPC .... *H01L 21/31116* (2013.01); *H01L 21/31122* (2013.01)

(58) Field of Classification Search
CPC ............. H01L 21/31144; H01L 21/31116; H01L 21/3065; H01L 21/02164; H01L 21/32137
USPC .................................. 438/253, 710
See application file for complete search history.

(56) References Cited

U.S. PATENT DOCUMENTS

| 2002/0132486 | A1* | 9/2002 | Williams | H01L 21/3065 438/712 |
| 2003/0042465 | A1* | 3/2003 | Ko | H01L 21/31116 252/79.1 |
| 2008/0206965 | A1* | 8/2008 | Gluschenkov | H01L 21/02529 438/478 |
| 2009/0061634 | A1* | 3/2009 | Feurprier | H01L 21/31144 438/700 |
| 2010/0041207 | A1* | 2/2010 | Lee | C23C 16/045 438/435 |
| 2010/0224587 | A1* | 9/2010 | Mukawa | H01J 37/32027 216/13 |
| 2011/0233679 | A1* | 9/2011 | Chen | H01L 21/823431 257/368 |

\* cited by examiner

*Primary Examiner* — Duy T Nguyen
(74) *Attorney, Agent, or Firm* — Wood, Herron & Evans, LLP

(57) ABSTRACT

Techniques herein include methods for etching an oxide layer with greater selectivity to underlying channel materials. Such an increase in etch selectivity reduces damage to channel materials thereby providing more reliable and better performing semiconductor devices. Techniques herein include using fluorocarbon gas to feed a plasma to create etchants, and also creating a flux of ballistic electrons to treat a given substrate during an etch process.

20 Claims, 3 Drawing Sheets

METHOD FOR INCREASING OXIDE ETCH SELECTIVITY

BACKGROUND OF THE INVENTION

This invention relates to semiconductor processing, and, in particular, to methods and apparatus for etching materials on a substrate.

Various structures and devices are created during the fabrication of logic and memory microchips. For example, transistors, such as field effect transistors, or basic elements of microelectronics and integrated circuits. Fabricating such transistors generally involves depositing layers of various materials, patterning layers, transferring patterns, and removing materials. A common technique for pattern transfer is using a plasma-based etching process, also known as a dry etching process. Such etch-based pattern transfer typically involves a topographic pattern that functions as a mask so that etchants directed toward the substrate etch material in exposed portions of an underlying layer, while the mask prevents etching covered portions of the underlying layer.

SUMMARY

In various etch processes, it is common for two different types of materials to be exposed to etchants from a given etch process. In some microfabrication techniques it is desirable to etch (remove) one material type without etching a second material type even if both material types are exposed to etchants. In other words, it can be desirable for a first material to be etched while being selective to a second material. In practice, such etch selectivities are usually not perfect and thus etch selectivity can be described as an etch rate ratio of two materials (preferably with one material being etched at a relatively greater rate as compared to a rate of etching a second material).

In some microfabrication processes there can be multiple etch processes required for etching contact-like features through oxide materials and landing on (uncovering) source/drain materials. Such etch processes can be used to create both planar and three-dimensional transistor structures. Successfully executing some of these etch processes has been challenging because of poor selectivity associated with conventional etch techniques. Such challenges are particularly applicable process steps that specify etching through oxide material and landing on source/drain materials that include silicon having been doped to create compressive or tensile stresses, such as with silicon germanium. Techniques disclosed herein, however, provide a method of etching an oxide layer with greater selectivity to underlying channel materials. Such an increase in etch selectivity reduces damage to channel materials thereby providing more reliable and better performing semiconductor devices.

Techniques herein include methods for performing a selective etching process that can increase selectivity for etching oxide materials relative to channel materials. In one embodiment, a substrate is disposed on a substrate holder in a plasma processing system. The substrate has a patterned mask layer defining openings that expose an oxide layer. The substrate has a channel material underlying the oxide layer. A process gas mixture is flowed into the plasma processing system. The process gas mixture comprises a fluorocarbon gas. A plasma is formed from the process gas mixture such that the oxide layer, through the patterned mask layer, is exposed to the plasma. A plasma having been formed by applying radiofrequency power to the plasma processing system. Negative direct current power is applied to an upper electrode of the plasma processing system in addition to applying the radiofrequency power to the plasma processing system. The upper electrode has a plasma-facing surface comprising a conductive material that provides secondary electron emission in response to particle bombardment. The oxide layer is then etched relative to the channel material such that products from the plasma etch the oxide layer relative to the channel material at a ratio of at least about 7 to 1. With such improved etch selectivity, underlying channel materials are preserved for proper device functioning.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein include methods for etching an oxide layer with greater selectivity to underlying channel materials. Such an increase in etch selectivity reduces damage to channel materials thereby providing more reliable and better performing semiconductor devices. Techniques herein include using fluorocarbon gas to feed a plasma to create etchants, and also creating a flux of ballistic electrons to treat a given substrate during an etch process.

Techniques herein can be applied to oxide etching and to etching contact-like features through oxide and landing on a source/drain materials. For example, during middle-of-the-line etches, when etching through oxide and landing on silicon germanium ($Si_xGe_{1-x}$) there is poor etch selectivity in that a substantial portion of the SiGe is etched. Embodiments can be used for self-aligned contact etch processes, but are not limited to self-aligned contact etching.

Figure 1:
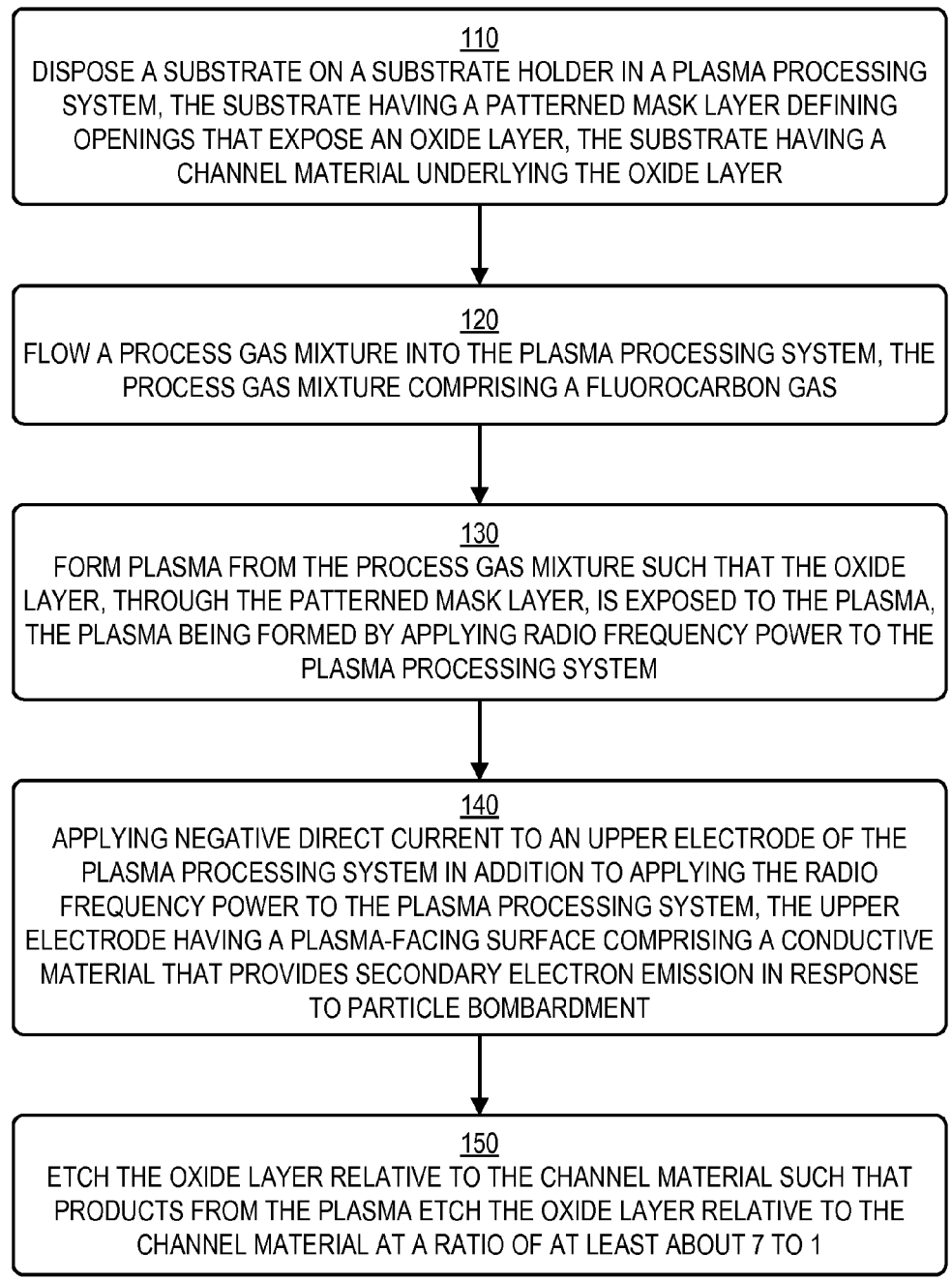
FIG. 1 is a flow chart of an example etch method according to embodiments herein.

FIG. 1 illustrates a flow chart describing one example embodiment for performing a selective etch process of features on a substrate. In step 110, a substrate is disposed on a substrate holder in a plasma processing system. The substrate has a patterned mask layer defining openings that expose an oxide layer. In other words, a topographic mask or relief mask/pattern is positioned above an oxide layer so as to protect certain portions of the oxide layer (such as fin support gate structures) while not protecting other portions of the oxide layer. A pattern mask layer can be embodied as a photoresist mask, hardmask, or metal hardmask. By way of a non-limiting example, such a pattern mask layer can be selected from silicon nitride ($S_3iN_4$). In other embodiments, the pattern mask layer can be an organic planarization layer, and amorphous carbon layer, dielectric hardmask, metal hardmask, and can be comprised of multiple different layers.

The oxide layer can be selected from any of various oxides such as silicon dioxide and tetraethyl orthosilicate, and can be applied as flowable oxide. In some embodiments, silicon oxide has a dielectric constant value of less than 4. In these example embodiments, the oxide layer can be selected from one or more materials including carbon-doped silicon oxide (SiOCH), fluorine-doped silicon oxide, CDO (carbon-doped oxide), phosphosilicate glass (PSG), nitrogen-doped silicon oxide, phosphorusoxide, and so forth.

The substrate has channel material or a channel material layer underlying the oxide layer. This channel material can be selected from various materials including silicon, doped silicon, strain silicon, and germanium. Strain silicon can be strained from inclusion of carbon, phosphorus, germanium, and so forth. The channel material can be a silicon-germanium ($Si_xGe_{1-x}$) alloy. In some embodiments, the channel material can form a source or drain of a microelectronics transistor including a fin of a fin field effect transistor (Fin-FET). The channel material can also comprise silicon in at least one III-V compound.

In step 120, a process gas mixture is flowed into the plasma processing system. This process gas mixture can comprise a fluorocarbon gas. The fluorocarbon gas can be CxFy, wherein x and y are greater than or equal to 1. In other embodiments the fluorocarbon gas is C4F6. The process gas mixture can further include a diluent gas and a passivation control gas. The diluent gas can be selected from, for example, argon, helium, and xenon. The passivation control gas can be selected from the group consisting of O2, CO2, CO, N2, H2, COS, and SO2.

In step 130, a plasma is formed from the process gas mixture such that the oxide layer, through the pattern mask layer, is exposed to the plasma. Note that the plasma itself (plasma sheath) may not come in direct contact with the substrate, but the oxide layers exposed in that products from the plasma can strike the oxide layer either isotropically or anisotropically. The plasma is formed by playing radio frequency power to the plasma processing system, that is, using the plasma processing system to couple radio frequency power to the process gas mixture above the substrate. Applying radio frequency power to the plasma processing system can include applying radiofrequency power to an upper or lower electrode. Note that various conventional plasma processing systems can be used with methods herein. One example plasma processing system will be described in more detail below.

In step 140, negative direct current power applied to an upper electrode of the plasma processing system. This is in addition to applying the radiofrequency power to the plasma processing system generate and maintain plasma. The upper electrode of the plasma processing system has a plasma-facing surface comprising a conductive material that provides secondary electron emission in response to particle bombardment. This secondary electron emission can be described as ballistic electrons because electrons emitted from the upper electrode are directed toward the substrate with sufficient energy to pass through the plasma. For example, products from the plasma can include positively charged ions. These positively charged ions can be attracted to the upper electrode by virtue of the negative direct current power applied. Upon striking the upper electrode, electrons from the upper electrode material can be dislodged and then accelerated away from the upper electrode because of the negative polarity. Striking the upper electrode can also sputter electrode material such as silicon which can be deposited on the substrate. In some embodiments, applying the negative direct current power to include applying about −500 to −1500 volts. The conductive material that provides secondary electron emission in response to particle bombardment can be selected from one or more materials including aluminum oxide, quartz, silicon, aluminum, titanium nitride, and aluminum nitride. Selection of a given upper electrode material can be based on substrate materials so that any sputtered upper electrode material that is deposited on the substrate will be compatible with substrate materials.

In step 150, the oxide layer is etched relative to the channel material such that products from the plasma etch the oxide layer relative to the channel material had a ratio of at least about 7 to 1. In other embodiments, the etch ratio can be greater than approximately 9 to 1. In other words, while fluorocarbon products are being directed toward the substrate to etch the oxide layer material, a flux of ballistic electrons simultaneously being directed towards the substrate. This combination improves oxide etch selectivity relative to underlying channel material so that upon exposing the underlying channel material to etch products, a relatively small amount of channel material is etched.

Figure 2:
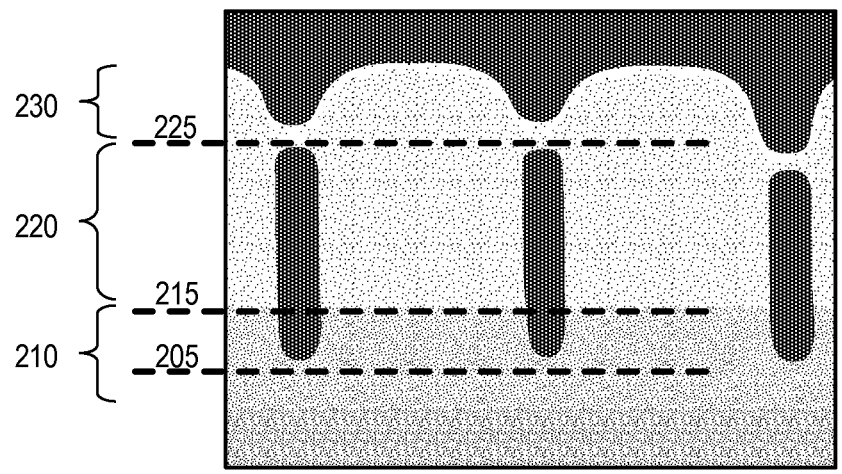
FIG. 2 is cross-sectional illustration of an example substrate segment having been etched using conventional techniques.
Figure 3:
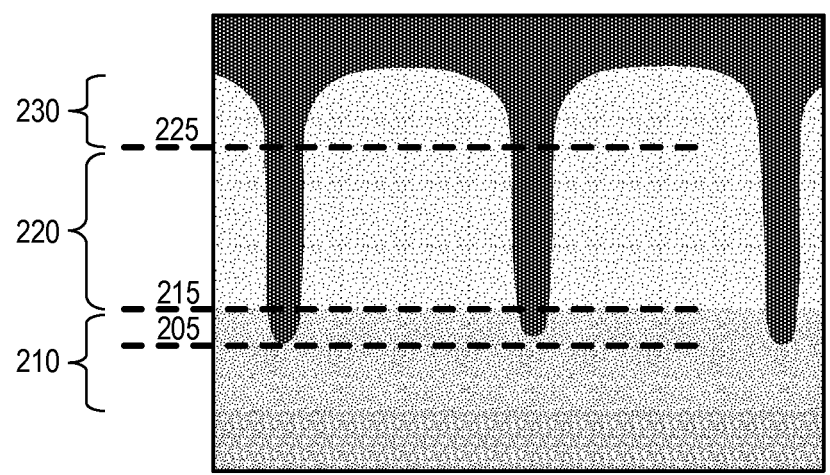
FIG. 3 is cross-sectional illustration of an example substrate segment having been etched according to embodiments herein.

FIGS. 2 and 3 help to illustrate this selectivity improvement. FIGS. 2 and 3 illustrate an example magnified cross-sectional image of a given wafer segment. FIG. 3 illustrates example results using conventional techniques, while FIG. 3 illustrates example results using etching techniques disclosed herein. Shown in these figures is patterned mask layer 230 (for example, silicon nitride), which is positioned on oxide layer 220. Underlying oxide layer 220 is channel material 210. Line 225 is superimposed to help demarcate an interface between patterned mask layer 230, and oxide layer 215. Line 215 is used to identify an interface between oxide layer 220 and channel material 210 (for example, SiGe). Line 205 indicates a depth of etching into channel material 210 using conventional etching techniques. Note that a relatively wide and deep trench is etched into channel material 210. It can be observed that the trench etched extends about 50% through the channel material 210. Such an etch depth can compromise electrical performance of fabricated structures (such as transistors). FIG. 3 shows example results using techniques herein. In FIG. 3, line 205 indicates a more shallow etch depth into channel material 210 as compared to FIG. 2, extending into only about 30% of the channel material layer. With less channel material removed, better electrical performance can be achieved. Note also that edges of the patterned mask layer 230 have less rounding in FIG. 3 as compared to FIG. 2

The direct current superposition treatment can be executed within a capacitively-coupled plasma (CCP) processing system, which typically forms plasma between two opposing, parallel plates (an upper electrode and a lower electrode). Typically a substrate rests on the lower electrode or a substrate holder positioned just above the lower electrode. Applying negative DC to an upper electrode then draws positively charges species toward the electrode. This electrode is made of, or coated with, a desired conductive material. Typically this conductive material is silicon, but other materials can be used (such as germanium) for specific applications.

Figure 4:
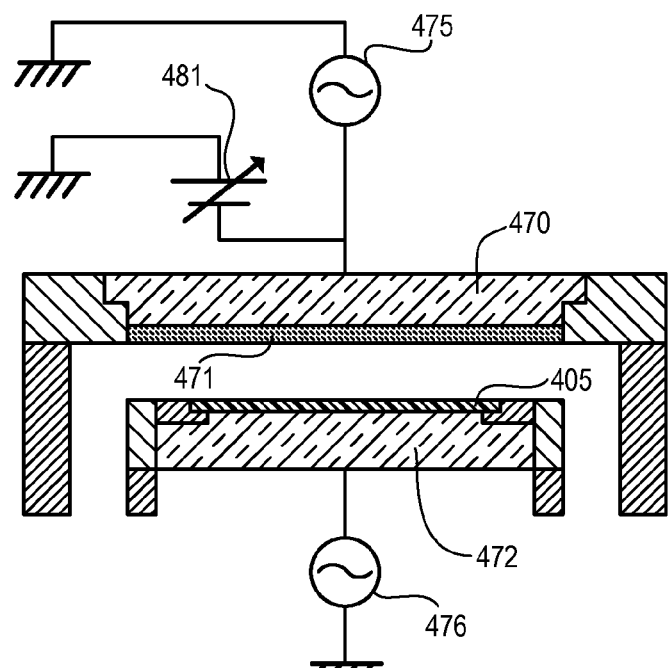
FIGS. 4 and 5 are schematic diagrams of plasma processing systems used with embodiments herein.
Figure 5:
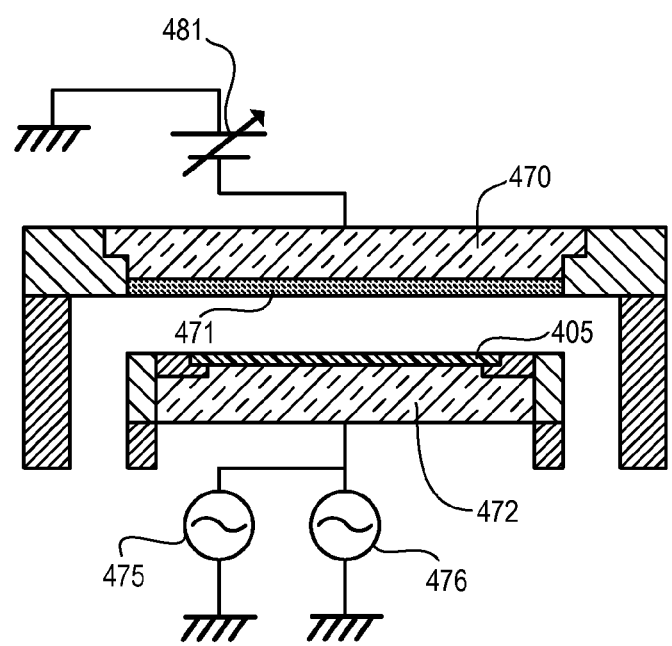

FIGS. 4 and 5 are schematic diagrams of parallel plate CCP processing systems. An upper electrode 470 is positioned opposite of where substrate 405 is positioned. The upper electrode 470 can include an electrode plate 471, which can be removable. Substrate 405 is positioned on lower electrode 472, or a holder immediately above lower electrode 472. Not shown is a process gas delivery system. Process gas can be flow into the processing chamber through a shower head electrode and/or from side chamber inlets. CCP processing chambers are already known and so not all features and components of such systems are described herein.

There are two basic electrical configurations of a CCP processing chamber. In each configuration there is a source radio frequency (RF) power that creates and maintains plasma from process gasses, and there is also a bias RF power that can be optionally applied to anisotropically draw plasma species towards a substrate being processed. A common source RF power can be applied at 60 MHz or higher (even very high frequencies (VHF)), while a common bias frequency is 13 MHz or 2 Mhz, though other frequencies can be used for particular applications. In one configuration, shown in FIG. 9, a source power 475 and bias power 476 are decoupled in that source RF power 475 is applied to upper electrode 470, while bias power 476 is applied to a lower electrode 472 (substrate containing electrode). In FIG. 5, both source RF power 475 (high frequency) and bias RF power 476 (low frequency) are applied to the lower electrode 421. In either configuration, a negative direct current voltage 481 can be applied to the upper electrode 470 and can be considered as superimposed DC voltage to a CCP system that already has a source power and possibly a bias power. Thus, this technique can be described as direct current superposition (DCS).

By way of a non-limiting example, DC voltage applied can be around 1 kilovolt (kV), with current around 2.5 milliamps per centimeter squared. When negative DC voltage is applied to the upper electrode, the upper electrode attracts positive ions within plasma that exists between the parallel plate electrodes. The positive ions that are accelerated toward the upper electrode plate 471 have sufficient energy that upon striking the upper electrode plate 471, the positive ions produce secondary electrons as well as sputtering some of the silicon. The secondary electrons produced then get accelerated by (away from) the negative DC voltage, receiving sufficient energy to travel entirely through the plasma and strike the substrate 405 below. Having around 1 keV of energy (or more), these electrons can easily pass through the plasma and wafer sheath. These electrons can be referred to as ballistic electrons. These electrons can strike the substrate with sufficient energy to pass through (into) substrate layers that are several hundred nanometers thick.

In embodiments in which electrode plate 471 is made of silicon, the silicon atoms that have been sputtered from the upper electrode can be deposited on the wafer below. The top electrode 471 should be selected from a conducting material to enable creating a beam of ballistic electrons. Any number of process gasses can be used for creating plasma for this DCS treatment of a substrate. For example, Nitrogen and Argon ions have sufficient energy to easily sputter a silicon electrode. In many applications, a noble gas can be used alone or in combination with other gasses. For example a mixture of Argon and hydrogen or nitrogen can be used. For curing applications, a mixture of argon and nitrogen can produce beneficial results.

Note that because this technique consumes an upper electrode, the upper electrode needs to be replaced after a specific amount of use or degree of depletion. Accordingly, using an electrode plate can facilitate this maintenance. Note that other conductive materials (typically metals) can be used as the upper electrode, but atoms from whichever conductive material is selected will most likely sputter and be deposited on a substrate below. In the semiconductor industry, many metals deposited on a wafer can have a negative effect on device fabrication or become corroded, but silicon deposition is generally a non-harmful material in conventional processes. Germanium and other materials can also be used.

The electron flux (ballistic electrons or e-beam) can produce dangling bonds of various resist chemical groups, which can enable cross-linking of the resist, thereby changing the resist's physical properties. An oxide layer can be formed from the DCS treatment. Initially, a layer of pure silicon develops on the substrate surface because of silicon sputtering, but as soon as the substrate leaves the etch processing chamber into an oxygen environment (out of the vacuum chamber), the pure silicon layer will immediately or quickly oxidize and form a silicon oxide layer. The silicon oxide layer can then also act as a protective layer. This negative polarity DC coupling results in sputtering of the top electrode. The amount of sputtering can be controlled, however, to result in a specific thickness of silicon deposited on the substrate (12 nm, 6 nm, 2 nm, etc.), such as a thickness sufficient to help protect an underlying resist layer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for performing a selective etching process of features on a substrate, the method comprising:
    disposing a substrate on a substrate holder in a plasma processing system, the substrate having a patterned silicon nitride mask layer defining openings that expose an oxide layer, the substrate having a SiGe channel material directly underlying the oxide layer;
    flowing a process gas mixture into the plasma processing system, the process gas mixture consisting of a CxFy fluorocarbon gas wherein x and y are greater than or equal to 1, a diluent gas selected from the group consisting of argon, helium, and xenon, and a passivation control gas selected from the group consisting of O2, CO2, CO, N2, H2, COS, and SO2;
    forming plasma from the process gas mixture such that the oxide layer, through the patterned mask layer, is exposed to the plasma, the plasma being formed by applying radio frequency power to the plasma processing system;
    applying negative direct current power to an upper electrode of the plasma processing system in addition to applying the radio frequency power to the plasma processing system, the upper electrode having a plasma-facing surface comprising a conductive material that provides secondary electron emission in response to particle bombardment; and
    etching the oxide layer relative to the SiGe channel material such that products from the plasma etch the oxide layer relative to the SiGe channel material at a ratio of at least about 7 to 1.

2. The method of claim 1, wherein the ratio of etching the oxide layer to the SiGe channel material is greater than about 9 to 1.

3. The method of claim 1, wherein the oxide layer is selected from the group consisting of flowable oxide, tetraethyl orthosilicate and silicon dioxide.

4. The method of claim 1, wherein the oxide layer is selected from the group consisting of carbon-doped silicon oxide (SiOCH), fluorine-doped silicon oxide, CDO (carbon-doped oxide), phosphosilicate glass (PSG), nitrogen-doped silicon oxide, phosphorusoxide, phosphorus-doped silicon oxide, hydrogen-doped silicon oxide, boron-doped silicon oxide, and a silicon oxide.

5. The method of claim 1, wherein the SiGe channel material forms a source or drain of a microelectronics transistor.

6. The method of claim 1, wherein the SiGe channel material is a fin of a fin field effect transistor (FinFET).

7. The method of claim 1, wherein applying the negative direct current power includes applying about −500 to −1500 volts.

8. The method of claim 1, wherein the conductive material that provides secondary electron emission in response to particle bombardment is selected from the group consisting of aluminum oxide, quartz, silicon, aluminum, titanium nitride, and aluminum nitride.

9. The method of claim 1, wherein the fluorocarbon gas is C4F6.

10. The method of claim 1, wherein etching the oxide layer includes executing a self-aligned contact etching process.

11. The method of claim 1, wherein applying the radio frequency power to the plasma processing system includes applying the radio frequency power to the upper electrode.

12. The method of claim 1, wherein applying the radio frequency power to the plasma processing system includes applying the radio frequency power to a lower electrode positioned below the substrate.

13. The method of claim 1, wherein the oxide layer is carbon-doped silicon oxide (SiOCH).

14. A method for performing a selective etching process of features on a substrate, the method comprising:
    disposing a substrate on a substrate holder in a plasma processing system, the substrate having a patterned mask layer defining openings that expose an SiOCH layer, the substrate having a SiGe channel material underlying the SiOCH layer;
    flowing a process gas mixture into the plasma processing system, the process gas mixture consisting of a CxFy fluorocarbon gas wherein x and y are greater than or equal to 1, a diluent gas selected from the group consisting of argon, helium, and xenon, and a passivation control gas selected from the group consisting of O2, CO2, CO, N2, H2, COS, and SO2;
    forming plasma from the process gas mixture such that the SiOCH layer, through the patterned mask layer, is exposed to the plasma, the plasma being formed by applying radio frequency power to the plasma processing system;
    applying negative direct current power to an upper electrode of the plasma processing system in addition to applying the radio frequency power to the plasma processing system, the upper electrode having a plasma-facing surface comprising a conductive material that provides secondary electron emission in response to particle bombardment; and
    etching the SiOCH layer relative to the SiGe channel material such that products from the plasma etch the SiOCH layer relative to the SiGe channel material at a ratio of at least about 7 to 1.

15. The method of claim 14, wherein the ratio of etching the SiOCH layer to the SiGe channel material is greater than about 9 to 1.

16. The method of claim 14, wherein the SiGe channel material forms a source or drain of a microelectronics transistor.

17. The method of claim 14, wherein the SiGe channel material is a fin of a fin field effect transistor (FinFET).

18. The method of claim 14, wherein applying the negative direct current power includes applying about −500 to −1500 volts.

19. The method of claim 14, wherein the conductive material that provides secondary electron emission in response to particle bombardment is selected from the group consisting of aluminum oxide, quartz, silicon, aluminum, titanium nitride, and aluminum nitride.

20. The method of claim 14, wherein the patterned mask layer is silicon nitride.

* * * * *